United States Patent [19]
Shima

[11] Patent Number: 6,072,416
[45] Date of Patent: Jun. 6, 2000

[54] ANALOG-TO-DIGITAL CONVERTER CIRCUIT

[75] Inventor: Takeshi Shima, Kanagawa-ken, Japan

[73] Assignee: Kabushiki Kaisha Toshiba, Kawasaki, Japan

[21] Appl. No.: 09/089,485

[22] Filed: Jun. 2, 1998

[30] Foreign Application Priority Data

Jun. 4, 1997 [JP] Japan .............................. P0 9-146455

[51] Int. Cl.[7] .................................................... H03M 1/36
[52] U.S. Cl. ............................................................. 341/159
[58] Field of Search ................................... 341/159, 155, 341/156, 161

[56] References Cited

U.S. PATENT DOCUMENTS 5,841,389  11/1998  Kinugasa et al. ........................ 341/159
5,877,720  3/1999   Setty et al. ............................... 341/159

OTHER PUBLICATIONS

Kattmann et al., "A Techinque For Reducing Differential Non–Linearity Errors In Flass A/D Converters", IEEE International Solid–State Circuits Conference, pp. 170, 171, (1991).

Bult et al., "A 170mW 10b 50M Sample/s CMOS ADC in 1mm$^2$", IEEE International Solid–State Circuits Conference, pp. 136–137, 1997).

C. Mead, "Analog JLSI And Neural Systems", Addison—Wesley Publishing Company, Massachusetts, p. 106, (1989).

*Primary Examiner*—Brian Young
*Attorney, Agent, or Firm*—Foley & Lardner

[57] ABSTRACT

An analog-to-digital converter circuit, such as a flash-type A/D converter, has a plurality of voltage comparators. Each voltage comparator has first and second input terminals and an output terminal. The voltage comparators are arranged in order of reference voltages $V_{ref1}$, $V_{ref2}$, $V_{ref3}$, $V_{ref4}$, and $V_{ref5}$ supplied to the respective second input terminals of the voltage comparators. Each voltage comparator is connected to the adjacent voltage comparator and the adjacent voltage comparator but one via a first resistor and a second resistor, respectively. The presence of the second resistors makes it possible to improve the degree of contributions of the voltage comparators positioned farther away from the center comparator. Accordingly, conversion deviations are reduced when the outputs of the respective comparators are added and averaged, thereby enhancing conversion precision. As a consequence, the voltage comparators are improved in comparison precision and comparison speed.

12 Claims, 9 Drawing Sheets

ANALOG-TO-DIGITAL CONVERTER CIRCUIT

BACKGROUND OF THE INVENTION

1. Field of the Invention

The present invention generally relates to analog-to-digital (A/D) converter circuits for converting analog input signals into digital output signals. More particularly, the invention relates to an A/D converter that reduces the conversion deviation of a voltage comparison circuit, which would otherwise cause problems when the A/D converter is formed into an integrated circuit.

2. Description of the Related Art

Among the conversion methods used for A/D converters for converting analog input values into digital output values, a method, which is referred to as the "parallel (flash) conversion method" is known. In this method, a common analog input signal is input in parallel into a plurality of voltage comparators having different respective reference voltages, thereby instantaneously comparing the analog input value with the respective reference voltages. Upon comparison, the logical outputs (1 or 0) of the voltage comparators are then coded in binary form and are output.

The above flash conversion method is suitable for digitizing signals which have been sampled with a high sampling rate. On the other hand, this method requires as many voltage comparators as the number of conversion steps, i.e., the number of quantizing steps. The voltage comparator is, in general, a circuit that compares an input voltage with a reference voltage and then outputs the logical level 1 or 0. When such voltage comparators are formed into an integrated circuit, the uniformity of the voltage comparators is very difficult to achieve. A slight deviation of an input voltage from the reference voltage may sometimes change the output of the voltage comparator from logical 1 to logical 0 and vice versa. Accordingly, the width of a quantizing step cannot be set to be smaller than the above deviation threshold, which limits the conversion precision.

In order to solve the above problem concerning the deviation of outputs of voltage comparators, flash A/D converters aimed at improved conversion precision by utilizing the Hoashi & Millman's theorem (Ichiro Sakakigome, *University Course Electric Circuit* (1), Ohmsha, Ltd. 1996, pp. 126–127) are conventionally proposed. As an example of the above converters, the technique disclosed in the following technical document is known: K. Kattman, J. Barrow, "*A technique for reducing differential nonlinearity errors in flash A/D converters*", ISSCC Digest of Technica. Papers, pp. 170–171, February 1991 (hereinafter document (1)). In this technique, the above theorem is realized by arranging a plurality of voltage comparators in parallel in order of their reference voltages and by connecting the output terminals of adjacent voltage comparators to each other via resistors. With this configuration, the comparator outputs are added and averaged, thereby reducing the conversion deviations.

The technique disclosed in document (1) is further improved by the following technical document: K. Bult, A. Buchwald, J. Laskowski, "A 170 mW 10b 50M Sample/s CMOS ADC in 1 mm$^2$", ISSCC Digest of Technical Papers, pp. 136–137, February 1997 (hereinafter document (2)). In technique, a plurality of flash A/D converters are used so that outputs of a plurality of comparators are averaged more precisely, thereby further enhancing the conversion precision.

It has been reported that the above improved flash A/D converters disclosed in document (2) effectively obtained a conversion precision on the order of 10 bits with a sampling rate of 50 MHz even when it was formed into a CMOS LSI circuit. This indicates that the error of the conversion precision of the voltage comparator is as low as 1 mV with respect to the input voltage. It is thus shown that the above technique is effective at improving the conversion precision.

However, it is difficult to obtain a conversion precision higher than the above level by the known A/D converters. For example, analog signals which require a higher sampling rate, such as RF signals, cannot be directly converted into digital signals for the following reason.

As noted above, known A/D converters are merely configured in such a manner that a plurality of voltage comparators are arranged in parallel and the output terminals of adjacent voltage comparators are connected to each other via resistors. Thus, the degree of contribution of one comparator to the output of another comparator is inversely proportional to the distance between the comparators. Accordingly, the degree of contribution between the comparators positioned farther away from each other is smaller. Thus, even if the outputs of such comparators are averaged, the conversion precision fails to be sufficiently improved.

Moreover, in known A/D converters, an output of the comparator positioned at the center is influenced by substantially the same number of both comparators located at the upper side having reference voltages higher than the center comparator and comparators located at the lower side having reference voltages lower than the center comparator. However, concerning the peripheral comparators, the influence of contributions from the other comparators is biased to either the higher reference voltage or the lower reference voltage. This drawback is more noticeable for the comparators located farther away from the center comparator. Consequently, depending on the input voltage value, outputs of the contributing comparators may be biased by a positive value or a negative value, thereby apparently changing the reference voltages of the peripheral comparators. This further lowers the integral nonlinearity, which is used as an index of performance of A/D converters.

SUMMARY OF THE INVENTION

Accordingly, it is an object of the present invention to provide an analog-to-digital converter that obtains a sufficient level of conversion precision by improving the technique for adding and averaging outputs of a plurality of comparators, which are formed of a center comparator and peripheral comparators, and by suitably processing outputs of the peripheral comparators.

In order to achieve the above object, according to one aspect of the present invention, there is provided an analog-to-digital converter circuit including N number of voltage comparators, each having a first input terminal, a second input terminal, and an output terminal. An input signal is supplied to the first input terminals of N number of voltage comparators, and N number of different reference voltages are supplied to the second input terminals of N number of voltage comparators, respectively. Accordingly, the A/D converter converts outputs of N number of voltage comparators into digital data and outputs it. N-n1 , (where n1>1), number of first resistors are provided to connect the output terminals of N number of voltage comparators, which are arranged in accordance with levels of N number of reference voltages. Each of the N-n1 number of first resistors connects the output terminals of two of N number of voltage comparators which are positioned away from each other by n1 number of voltage comparators.

According to the above A/D converter circuit, by the provision of the first resistors, the degree of contributions of the comparators positioned farther away from the center comparator can be improved. Thus, conversion deviations are reduced when the outputs of the respective comparators are added and averaged over known voltage comparators in which the degree of contributions of the comparators positioned farther away from the center comparator is smaller. Conversion precision is thus improved.

The foregoing A/D converter circuit may further include N−1 number of second resistors for connecting the output terminals of N number of voltage comparators. Each of N−1 number of second resistors connects the output terminals of two of N number of voltage comparators which are positioned adjacent to each other. The foregoing A/D converter circuit may further include N-n2 (n2>n1) number of third resistors for connecting the output terminals of N number of voltage comparators. Each of N-n2 number of third resistors connects the output terminals of two of N number of voltage comparators which are positioned away from each other by n2 number of voltage comparators. Alternatively, the foregoing A/D converter circuit may include both N−1 number of second resistors and N-n2 number of third resistors. With this arrangement, the effect of the averaging the outputs of the voltage comparators can be further enhanced.

According to another aspect of the present invention, there is provided an A/D converter circuit including N number of voltage comparators, each having a first input terminal, a second input terminal, and an output terminal. An input signal is supplied to the first input terminals of N number of voltage comparators, and N number of different reference voltages are supplied to the second input terminals of N number of voltage comparators, respectively. Accordingly, the A/D converter circuit converts outputs of N number of voltage comparators into digital data and outputs it. N-n1 , (where n1>1), number of first resistors are provided to connect the output terminals of N number of voltage comparators, which are arranged in accordance with levels of N number of reference voltages. Each of the N-n1 number of first resistors connects the output terminals of two of N number of voltage comparators which are positioned away from each other by n1 number of voltage comparators. Alternatively, N−1 number of second resistors are provided to connect the output terminals of N number of voltage comparators. Each of the N−1 number of second resistors connects the output terminal of two of N number of voltage comparators which are positioned adjacent to each other. A selection circuit is provided to select, based on the outputs of N number of voltage comparators, M (M<N) number of voltage comparators from N number of voltage comparators in accordance with the voltage level of the input signal.

With this arrangement, the range of the reference voltages used for comparison with the input signal can be shifted in accordance with the voltage level of the input signal, which would otherwise lower the integral nonlinearity caused by the peripheral comparators positioned farther away from the center comparator, thereby improving conversion precision.

According to still another aspect of the present invention, there is provided an A/D converter circuit including N number of voltage comparators, each having a first input terminal, a second input terminal, and an output terminal. An input signal is supplied to the first input terminals of N number of voltage comparators, and N number of different reference voltages are supplied to the second input terminals of N number of voltage comparators, respectively. Accordingly, the A/D converter converts outputs of N number of voltage comparators into digital data and outputs it. N-n1 (n1≧1) number of first series circuits, each being formed by connecting a first resistor and a first switch in series to each other, are provided to connect the output terminals of N number of voltage comparators, which are arranged in accordance with levels of N number of reference voltages. Each of N-n1 number of first series circuits connects the output terminals of two of N number of voltage comparators which are positioned away from each other by n1 number of voltage comparators. The opening and closing of the first switches of N-n1 number of first series circuit are controlled based on outputs of N number of voltage comparators so as to select M (M<N) number of voltage comparators from N number of voltage comparators in accordance with the voltage level of the input signal.

With this arrangement, the effect of A/D converters implemented by resistors can be obtained by performing simple switching control.

The foregoing A/D converter circuit may further include N-n2, (where n2>n1), number of second series circuits, each being formed by connecting a second resistor and a second switch in series to each other, for connecting the output terminals of N number of voltage comparators. Each of the N-n2 number of second series circuits connects the output terminals of two of N number of voltage comparators which are positioned away from each other by n2 number of voltage comparators. The opening and closing of the second switches of the second series circuits are controlled based on outputs of N number of voltage comparators.

According to a further aspect of the present invention, there is provided an A/D converter circuit including N number of voltage comparators, each having a first input terminal, a second input terminal, and an output terminal. An input signal is supplied to the first input terminals of N number of voltage comparators, and N number of different reference voltages are supplied to the second input terminals of N number of voltage comparators, respectively. Accordingly, the A/D converter converts outputs of N number of voltage comparators into digital data and outputs it. N-n1, (where n1≧1), number of first resistors are provided to connect the output terminals of N number of voltage comparators, which are arranged in accordance with levels of N number of reference voltages. Each of the N-n1 number of first resistors connects the output terminals of two of N number of voltage comparators which are positioned away from each other by n1 number of voltage comparators. Further, A/D conversion means are provided to perform A/D conversion corresponding to higher order bits of the digital data based on the voltage level of the input signal. Generation means are provided to generate N number of reference voltages supplied to the second terminals of N number of voltage comparators based on the conversion output of the higher order bits of the digital data so that the middle point of the range of N number of reference voltages corresponds to the level of the input signal.

With this arrangement, a rough A/D conversion corresponding to higher order bits of digital data is initially performed. A highly precise A/D conversion for the lower order bits of digital data is then performed through voltage comparison by N number of voltage comparators, the voltage comparison being made accurately through the use of a resistor circuit network. The reference voltages are determined so that the middle point of the range of the reference voltages equivalently corresponds to the level of the input signal, which is determined by a rough conversion corresponding to the higher order bits. Thus, the adverse influence of the peripheral comparators as described above is also prevented based on a theory similar to the theory of the foregoing A/D converter, which would otherwise lower the integral nonlinearity, thereby enhancing the conversion precision.

The foregoing A/D converter circuit may further include N-n2, (where n2>n1), number of second resistors for connecting the output terminals of N number of voltage comparators. Each of the N-n2 number of second resistors connects the output terminals of two of N number of voltage comparators which are positioned away from each other by n2 number of voltage comparators. The effect of adding and averaging the voltage comparators is further improved.

According to a yet further aspect of the present invention, there is provided an A/D converter including N number of voltage comparators, each having a first input terminal, a second input terminal, and an output terminal. An input signal is supplied to the first input terminals of N number of voltage comparators, and N number of different reference voltages are supplied to the second input terminals of N number of voltage comparators, respectively. Accordingly, the A/D converter circuit converts outputs of N number of voltage comparators into digital data and outputs it. N-n1, (where n1≧1), number of first resistors are provided to connect the output terminals of N number of voltage comparators, which are arranged in accordance with levels of N number of reference voltages. Each of the N-n1 number of first resistors connects the output terminals of two of N number of voltage comparators which are positioned away from each other by n1 number of voltage comparators. A first additional power supply source is provided at the outer side of one of the voltage comparators which is positioned farthest away from the center voltage comparator among N number of voltage comparators. The first additional power supply source generates a predetermined voltage determined by a positive saturated output voltage of N number of voltage comparators. A second additional power supply source is provided at the outer side of the other voltage comparator which is positioned farthest away from the center voltage comparator among N number of voltage comparators. The second additional power supply source generates a predetermined voltage determined by a negative saturated output voltage of N number of voltage comparators. First and second additional resistors are provided via which the first and second additional power supply sources are respectively connected to outputs of the two voltage comparators which are positioned farthest away from the center voltage comparator.

With this arrangement, by the provision of the first and second additional power supply sources, the A/D converter functions as if infinite voltage comparators were provided. This eliminates a biased output to a higher level or a lower level caused by the input voltage level, thereby making it possible to maintain the integral nonlinearity, which is used as an index of performance.

The foregoing A/D converter may further include N-n2, (n2>n1), number of second resistors for connecting the output terminals of N number of voltage comparators. Each of the N-n2 number of second resistors connects the output terminals of two of N number of voltage comparators which are positioned away from each other by n2 number of voltage comparators. Third and fourth additional resistors are provided via which the first and second additional power supply sources are respectively connected to the outputs of the two voltage comparators which are positioned farthest away from the center voltage comparator. Thus, the effect of adding and averaging the voltage comparators is further enhanced.

According to a further aspect of the present invention, there is provided an A/D converter circuit including N number of voltage comparators disposed in a ring-like shape. Each of the N number of voltage comparators has a first input terminal, a second input terminal, and an output terminal. An input signal is supplied to the first input terminals of N number of voltage comparators, and N number of different reference voltages are supplied to the second input terminals of the N number of voltage comparators, respectively. Accordingly, the A/D converter circuit converts the outputs of N number of voltage comparators into digital data and outputs it. N-n1, (n1≧1), number of first resistors are provided to connect the output terminals of N number of voltage comparators. Each of th N-n1 number of first resistors connects the output terminals of two of N number of voltage comparators which are positioned away from each other by n1 voltage comparators. Alternatively, N-n2, (n2>n1), number of second resistors are provided to connect the output terminals of N number of voltage comparators. Each of the N-n2 number of second resistors connects the output terminals of two of N number of voltage comparators which are positioned away from each other by n2 voltage comparators.

With this arrangement, N number of voltage comparators are disposed in a ring-like shape to apparently eliminate the presence of peripheral comparators, thereby improving conversion precision.

Moreover, for completely connecting the output terminals of the above-described N number of voltage comparator formed in a ring-like shape, the output terminals may be connected via resistors, the values of which are determined corresponding to the distances between the output terminals.

The foregoing A/D converter circuits may be modified as follows. Circuitry for calculating a difference between an input signal and an output signal of the N number of voltage comparators may be provided, and the difference may be fed back and again input into the voltage comparators. Then, the resulting A/D converter circuit is able to separately perform the higher order and the lower order A/D conversion, thereby achieving a reduction in the cost of hardware. The above type of circuitry may be easily implemented by a digital-to-analog (D/A) conversion circuit for converting the output signal of the comparators into an analog signal, and a subtraction circuit for determining the difference between an input signal and an output of the D/A conversion circuit.

Differential amplifiers may be used as the voltage comparators used in the foregoing A/D converter circuits. Moreover, the voltage comparators may be of the type having a finite output impedance or having a zero output impedance. If the zero-impedance voltage comparators are used as in the foregoing A/D converter circuits, one end of a resistor may be connected to the output of each voltage comparator and the other end of the resistor may be used as the output of the comparator.

Further objects, features and advantages of the present invention will become apparent from the following description of the preferred embodiments with reference to the attached drawings.

DETAILED DESCRIPTION OF THE PREFERRED EMBODIMENTS

Embodiments of the present invention are described in detail below with reference to the drawings.

Figure 1:
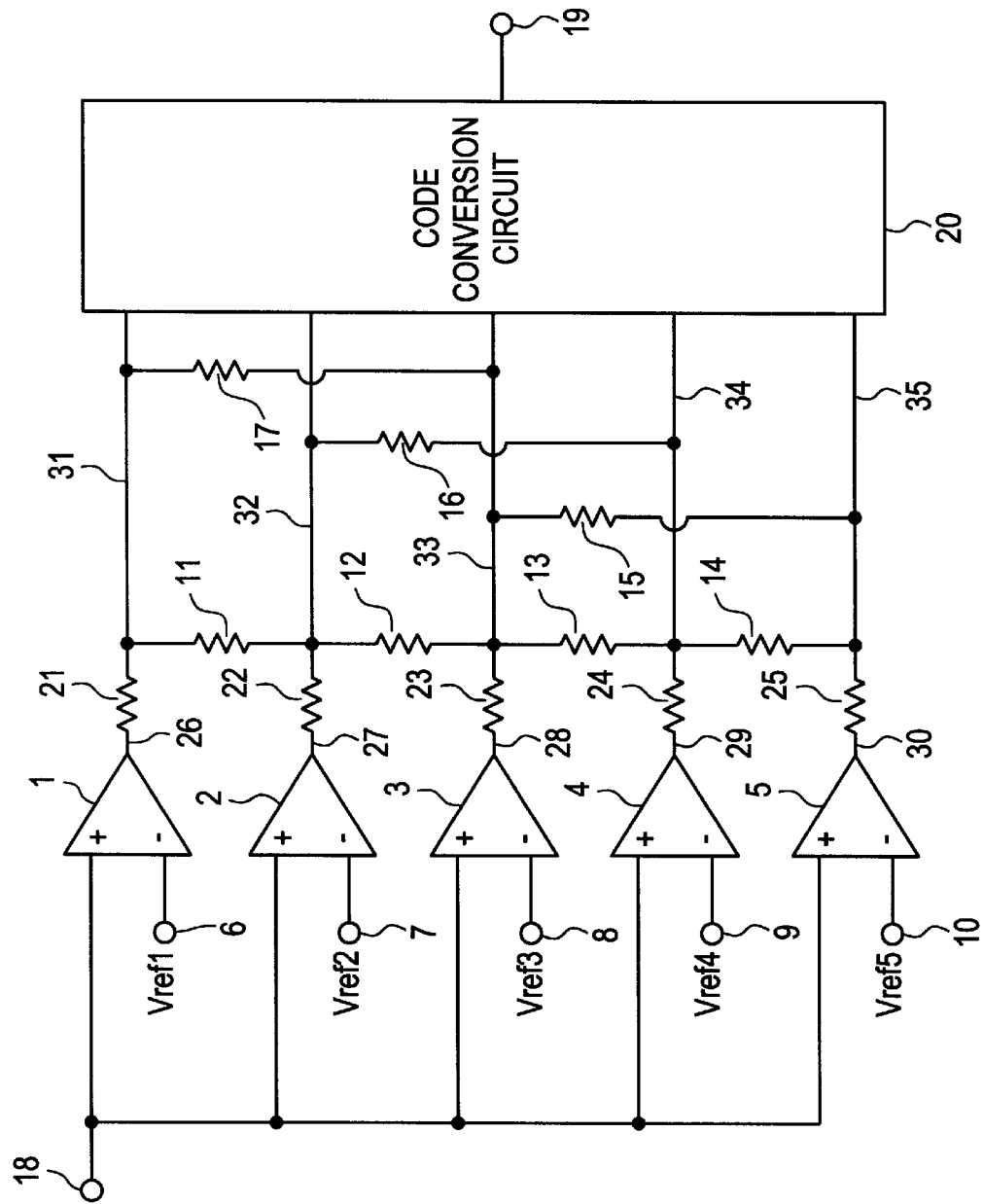
FIG. 1 illustrates the configuration of an A/D converter circuit according to a first embodiment of the present invention.

FIG. 1 illustrates the configuration of an analog-to-digital (A/D) converter circuit according to a first embodiment of the present invention. In FIG. 1, the A/D converter circuit includes ideal voltage comparators 1, 2, 3, 4, and 5, each having an output impedance of zero; second input terminals 6, 7, 8, 9, and 10 of the respective voltage comparators 1 through 5; first resistors 11, 12, 13, and 14; second resistors 15, 16, and 17; a first input terminal 18 through which analog signals are input; a digital data output terminal 19; a code conversion circuit 20 (Analog/Digital Converter) for converting the outputs of the voltage comparators 1 through 5 to a binary code; output impedances 21, 22, 23, 24, and 25 of the respective voltage comparators 1 through 5; output lines 26, 27, 28, 29, and 30 of the respective zero-impedance comparators 1 through 5; and output lines 31, 32, 33, 34, and 35 connected to the comparators 1 through 5 via the output impedances 21 through 25, respectively.

Supplied to the second input terminals 6 through 10 of the respective voltage comparators 1 through 5 are, as shown in FIG. 1, reference voltages $V_{ref1}$ through $V_{ref5}$, the magnitudes of which are indicated as follows.

$$V_{ref1} > V_{ref2} > V_{ref3} > V_{ref4} > V_{ref5}$$

The above reference voltages are generated by, for example, a resistor circuit network formed by connecting resistors in series to each other between power supply terminals. The operation of the A/D converter circuit constructed as described above is as follows.

The ideal voltage comparators 1 through 5 having an output impedance of zero are, in general, circuits that perform nonlinear mapping having saturation characteristics. If the voltage comparators 1 through 5 exhibit linear characteristics in the vicinity of the respective reference voltages, the output voltages $V_{ideal\_out}$ of the voltage comparators 1 through 5 are measured as the potentials of the output lines 26 through 30, respectively, and expressed by the following equations (1):

$$V_{ideal\_out\_26} = A \times (V_{in} - V_{ref1}) \quad (1)$$
$$V_{ideal\_out\_27} = A \times (V_{in} - V_{ref2})$$
$$V_{ideal\_out\_28} = A \times (V_{in} - V_{ref3})$$
$$V_{ideal\_out\_29} = A \times (V_{in} - V_{ref4})$$
$$V_{ideal\_out\_30} = A \times (V_{in} - V_{ref5})$$

and where $V_{in}$ indicates an input voltage into the first input terminal 18, and $V_{ref1}$ through $V_{ref5}$ represent reference voltages input into the second input terminals 6 through 10, respectively. The voltage $V_{real\_out\_28}$ measured at the output line 33, which includes the output impedances 21 through 25 of the voltage comparators 1 through 5, is expressed by the following equation (2):

$$V_{ideal\_out\_28} = \left\{ \frac{1}{(2Y_1 + Y_0 - Y_1Y_c)(2Y_1 + 2Y_2 + Y_0 - 2Y_2Y_d) + 2(Y_1 + Y_2Y_c)^2} \right\} \times \quad (2)$$
$$\{(Y_1Y_c + Y_2Y_c^2 + 2Y_1Y_d + Y_0Y_d - Y_1Y_cY_d)Y_0V_{ideal\_out\_26} +$$
$$(Y_1 + Y_2Y_c)Y_0V_{ideal\_out\_27} +$$
$$Y_0V_{ideal\_out\_28} +$$
$$(Y_1 + Y_2Y_c)Y_0V_{ideal\_out\_29} +$$
$$(Y_1Y_c + Y_2Y_c^2 + 2Y_1Y_d + Y_0Y_d - Y_1Y_cY_d)Y_0V_{ideal\_out\_30}\}$$

$$\text{where } Y_c = \frac{Y_1}{Y_1 + Y_2 + Y_0}, \quad Y_d = \frac{Y_2}{Y_1 + Y_2 + Y_0}$$

and where $Y_0$ indicates the conductance of each output impedance, $Y_1$ represents the conductance of each first resistor, and $Y_2$ indicates the conductance of each second resistor. To explain the effect of this embodiment, the foregoing A/D converter without the second resistors (i.e., $Y_2=0$) is used for comparison. The conditions of a known A/D converter are substituted into the above equation (2) to obtain the following equation (3).

$$V_{real\_out\_28} = \left\{ \frac{1}{(2Y_1 + Y_0 - Y_1Y_c)(2Y_1 + Y_0) + 2Y_1^2} \right\} \times \quad (3)$$
$$\{Y_1Y_cY_0V_{ideal\_out\_26} +$$
$$Y_1Y_0V_{ideal\_out\_27} +$$
$$Y_0V_{ideal\_out\_28} +$$
$$Y_1Y_0V_{ideal\_out\_29} +$$
$$Y_1Y_cY_0V_{ideal\_out\_30}\}$$

$$\text{where } Y_c = \frac{Y_1}{Y_1 + Y_0}$$

In forming voltage comparators 1 through 5 into an integrated circuit in the form of typical MOS transistors, the internal resistance of each conducting MOS transistor is from several kΩ to several MΩ. Thus, the conductances of the above respective elements in practice are indicated as follows considering the power consumption.

$$0 \leq Y_0 \leq 1,\ 0 \leq Y_1 \leq 1,\ 0 \leq Y_2 \leq 1$$

By using such feasible and practical values, a comparison is made between the first embodiment and a conventional A/D converter circuit. The output voltage of the conventional A/D converter expressed by equation (3) shows that the voltage comparators positioned farther away from the center comparator 3 contribute less to the output voltage $V_{real\_out\_28}$ measured at, for example, the output line 33. The coefficients of the terms concerning the outputs of the comparators 1 and 5 include the product of $Y_1$, $Y_C$, and $Y_0$, while the coefficients of the terms concerning the outputs of the comparators 2 and 4 contain the product of $Y_1$ and $Y_0$. In contrast, according to the output voltage of the first embodiment expressed by equation (2), the coefficients of the terms regarding the outputs of the comparators 1, 2, 4, and 5 include not only the product, but also the sum expression containing $Y_2$. The first embodiment is provided with the second resistors 15, 16, and 17, and the conductances thereof are selected within the above-described practical range. This makes it possible to set any given degree of contribution of the voltage comparators 1 through 5 to the output voltage $V_{real\_out\_28}$ measured at the output line 33.

Figure 2:
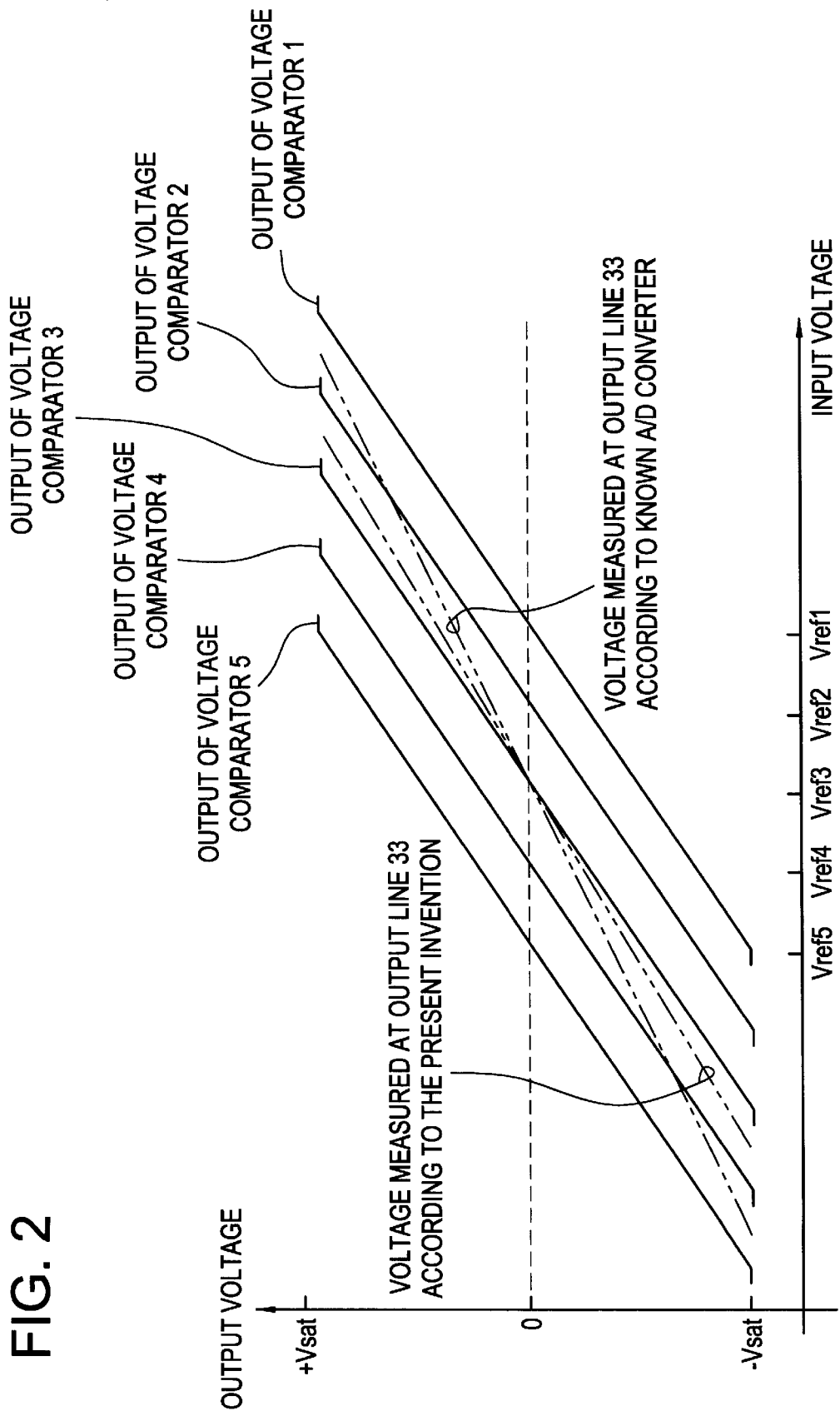
FIG. 2 illustrates the operation of the A/D converter circuit shown in FIG. 1.

The difference between the first embodiment and a known A/D converter circuit is further described with reference to the characteristic diagram of FIG. 2. In FIG. 2, the horizontal axis indicates the voltage input into the first input terminal 18 of the A/D converter shown in FIG. 1, while the vertical axis represents the outputs of the voltage comparators 1 through 5 and the potential measured at the output line 33. The scale $V_{sat}$ on the vertical axis depicts saturation voltages of the voltage comparators 1 through 5. The potential measured at the output line 33 of the known A/D converter circuit and that of this embodiment are shown.

According to the first embodiment, it is possible to increase the gradient of the output of the output line 33 relative to the input into the voltage converters 1 through 5, thereby improving the comparison sensitivity. Further, while considering influences of conversion errors caused by offset voltages $V_{offset}$, which are unavoidably generated when voltage comparators 1 through 5 are formed into an integrated circuit, the characteristics of the voltage comparators 1 through 5 are expressed by the following equations (4).

$$V_{ideal\_out\_26} = A \times (V_{in} - V_{ref1} - V_{offset\_1}) \tag{4}$$

$$V_{ideal\_out\_27} = A \times (V_{in} - V_{ref2} - V_{offset\_2})$$

$$V_{ideal\_out\_28} = A \times (V_{in} - V_{ref3} - V_{offset\_3})$$

$$V_{ideal\_out\_29} = A \times (V_{in} - V_{ref4} - V_{offset\_4})$$

$$V_{ideal\_out\_30} = A \times (V_{in} - V_{ref5} - V_{offset\_5})$$

If the reference voltages of the second input terminals 6 through 10 are set with regularly increasing values in steps of $\Delta$, the above equations (4) can be transformed into the following equations (5).

$$V_{ideal\_out\_26} = A \times (V_{in} - V_{ref3} - 2\Delta V_{offset\_1}) \tag{5}$$

$$V_{ideal\_out\_27} = A \times (V_{in} - V_{ref3} - \Delta V_{offset\_2})$$

$$V_{ideal\_out\_28} = A \times (V_{in} - V_{ref3} - V_{offset\_3})$$

$$V_{ideal\_out\_29} = A \times (V_{in} - V_{ref3} + \Delta - V_{offset\_4})$$

$$V_{ideal\_out\_30} = A \times (V_{in} - V_{ref3} + 2\Delta V_{offset\_5})$$

Then, the output voltage $V_{real\_out\_28}$ measured at the output line 33 can be expressed by the following equation (6).

$$V_{real\_out\_28} = \left\{ \frac{1}{(2Y_1 + Y_0 - Y_1 Y_c)(2Y_1 + 2Y_2 + Y_0 - 2Y_2 Y_d) + 2(Y_1 + Y_2 Y_c)^2} \right\} \times \tag{6}$$

$$\{(Y_1 Y_c + Y_2 Y_c^2 + 2Y_1 Y_d + Y_0 Y_d - Y_1 Y_c Y_d)Y_0 \cdot$$

$$A(V_{in} - V_{ref3} - V_{offset\_1}) +$$

$$(Y_1 + Y_2 Y_c)Y_0 \cdot A(V_{in} - V_{ref3} - V_{offset\_2}) +$$

$$Y_0 \cdot A(V_{in} - V_{ref3} - V_{offset\_3}) +$$

$$(Y_1 + Y_2 Y_c) \cdot A(V_{in} - V_{ref3} - V_{offset\_4}) +$$

$$(Y_1 Y_c + Y_2 Y_c^2 + 2Y_1 Y_d + Y_0 Y_d - Y_1 Y_c Y_d)Y_0 \cdot$$

$$A(V_{in} - V_{ref3} - V_{offset\_5})\}$$

$$\text{where } Y_c = \frac{Y_1}{Y_1 + Y_2 + Y_0},\ Y_d = \frac{Y_2}{Y_1 + Y_2 + Y_0}$$

On the other hand, the output voltage $V_{real\_out\_28}$ measured at an output line 33 of the known A/D converter circuit can be expressed by the following equation (7).

$$V_{real\_out\_28} = \left\{ \frac{1}{(2Y_1 + Y_0 - Y_1 Y_c)(2Y_1 + Y_0) + 2Y_1^2} \right\} \times \tag{7}$$

$$\{Y_1 Y_c Y_0 \cdot A(V_{in} - V_{ref3} - V_{offset\_1}) +$$

$$Y_1 Y_0 \cdot A(V_{in} - V_{ref3} - V_{offset\_2}) +$$

$$Y_0 \cdot A(V_{in} - V_{ref3} - V_{offset\_3}) +$$

$$Y_1 Y_0 \cdot A(V_{in} - V_{ref3} - V_{offset\_4}) +$$

$$Y_1 + Y_c Y_0 \cdot A(V_{in} - V_{ref3} - V_{offset\_5})\}$$

$$\text{where } Y_c = \frac{Y_1}{Y_1 + Y_0}$$

The above equations (6) and (7) include the terms representing errors, such as $V_{offset\_1}$, $V_{offset\_2}$, $V_{offset\_3}$, $V_{offset\_4}$, and $V_{offset\_5}$, as well as the term for calculating $A(V_{in} - V_{ref3})$, which is originally the major function of the voltage comparators 1 through 5. The term for calculating $A(V_{in} -$ $V_{ref3}$) serves to improve the gain of the voltage comparators 1 through 5 by adding the five terms for the same function, while the error terms $V_{offset\_1}$, $V_{offset\_2}$, $V_{offset\_3}$, $V_{offset\_4}$, and $V_{offset\_5}$ are added so as to average the errors. For example, the randomly distributed errors are expressed by a Gaussian distribution curve and are then added and averaged to zero. In this manner, according to the improved circuit of this embodiment, the average of errors can be approximated to zero, and also, the variation in the averaged output voltages can be reduced. In equation (7) expressing the output value of the known A/D converter circuit, the coefficient of the term for the output of the comparator positioned farther away from the center comparator is smaller. In equation (6) expressing the output value of the first embodiment, however, all the coefficients can be approximated to unity since the coefficients of the terms for the outputs of the respective voltage comparators contain sum expressions. This enhances the conversion precision when the voltage comparators of this embodiment are used in an A/D converter circuit.

Further, according to the improved circuit of this embodiment, the outputs of the voltage comparators located farther away from the center comparator are directly referred to by using the second resistors. This eliminates the inconsistencies in which a comparator located farther away from the center comparator contributes less to the outputs of the other comparators, thereby achieving the addition of the comparator outputs with balanced weights. It is also possible to provide a high speed A/D converter circuit that requires a shorter period of time to output a converted voltage over known A/D converter circuits.

Figure 3:
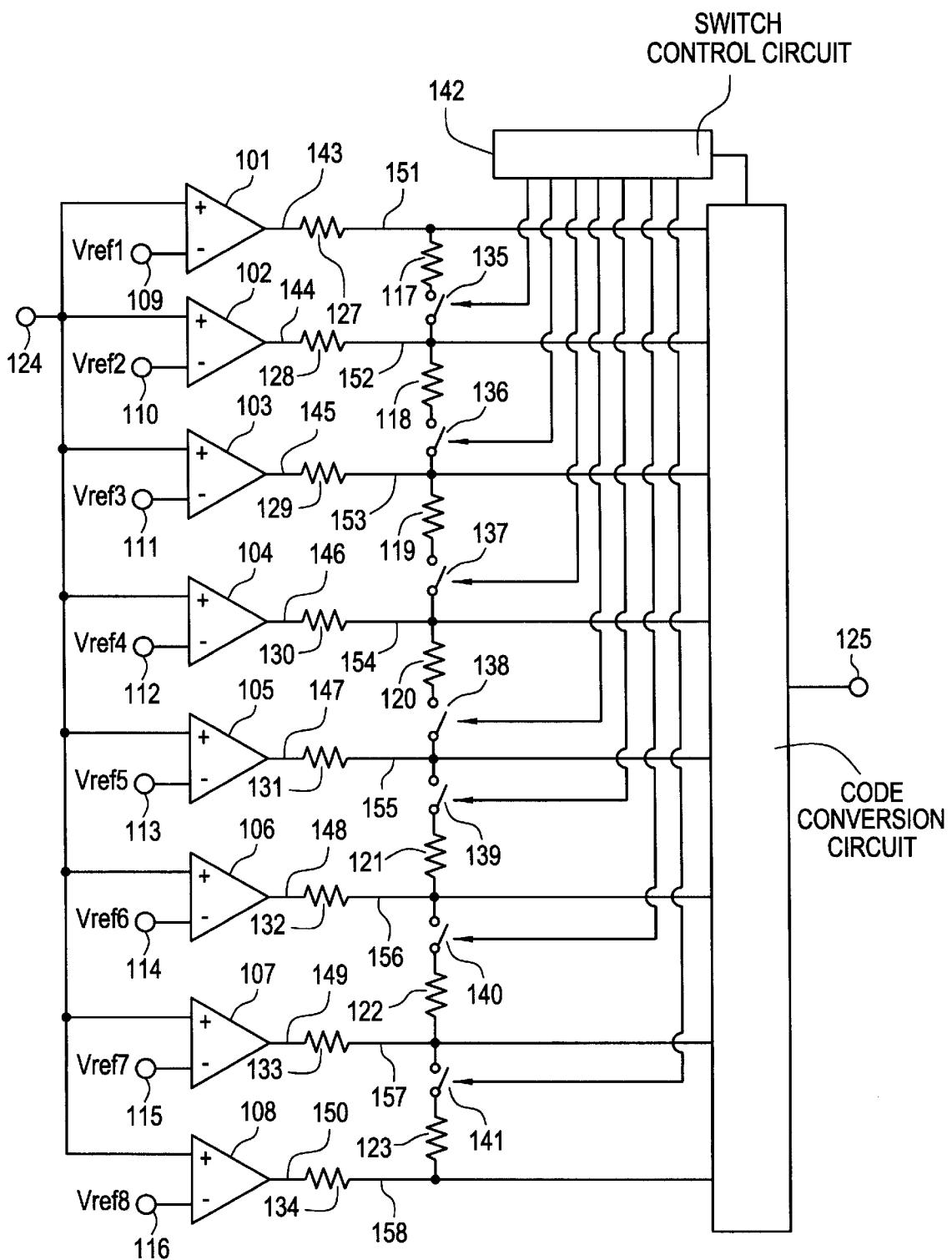
FIG. 3 illustrates the configuration of an A/D converter circuit according to a second embodiment of the present invention.
Figure 4:
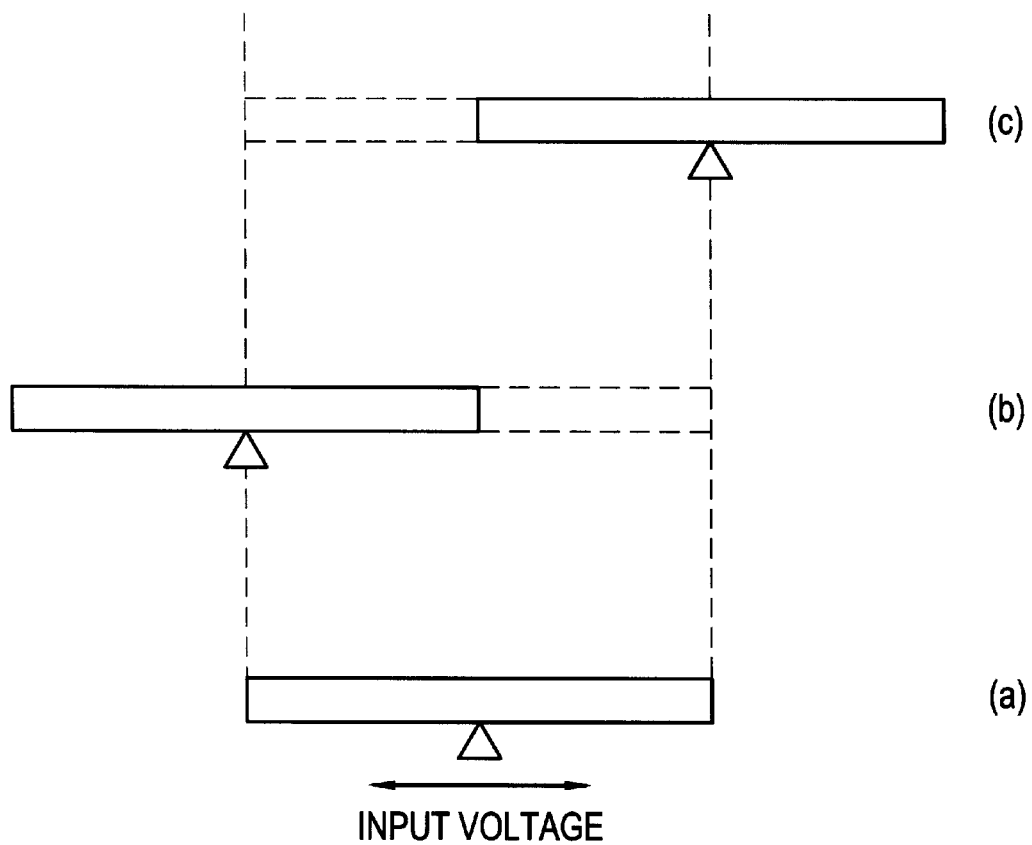
FIG. 4 illustrates the theory of the A/D converter circuit shown in FIG. 3.

FIG. 3 illustrates the configuration of an A/D converter circuit according to a second embodiment of the present invention. FIG. 4 illustrates the theory of the second embodiment. A description is first given of the theory of the second embodiment with reference to the figures.

Referring back to the first embodiment shown in FIG. 1, for reducing conversion deviations, the output of the voltage comparator 3 is weighted by adding the outputs of the voltage comparators 1, 2, 4, and 5. Since the output of the voltage comparator 4, for example, is weighted by adding the outputs of the voltage comparators 1, 2, 3, and 5, the reference voltage $V_{ref4}$ seems to be shifted to the reference voltage $V_{ref3}$. Namely, concerning a peripheral comparator positioned away from the center comparator, the weights of the outputs of the other comparators through the use of the first resistors is biased to either a higher reference voltage $V_{ref}$ or a lower reference voltage $V_{ref}$. This effect is more noticeable for a voltage comparator located farther away from the center comparator 3. Such shifting of a comparator lowers the integral nonlinearity, which is used as an index of performance of A/D converters.

The above effect is understood more clearly from FIG. 4 which illustrates the theory of the second embodiment of the present invention. The bottom part (a) of FIG. 4 indicates the concept of a seesaw. The vertex (support point) of the triangle represents an input voltage. The seesaw is balanced when the support point is positioned around the middle point. If, however, the support point is shifted to the right or the left, the seesaw loses its balance. The loss of balance of the seesaw represents the apparent shifting of the reference voltage described above. In order to overcome this drawback, the seesaw plate is moved in accordance with the shifting of the support point, as shown in the middle part (b) and the upper part (c) of FIG. 4. This makes it possible to constantly keep the seesaw in a balanced position. An A/D converter circuit constructed in accordance with this theory is shown in FIG. 3.

In FIG. 3, the A/D converter circuit includes ideal voltage comparators 101, 102, 103, 104, 105, 106, 107, and 108, each having an output impedance of zero, second input terminals 109, 110, 111, 112, 113, 114, 115, and 116 of the respective voltage comparators 101 through 108, first resistors 117, 118, 119, 120, 121, 122, and 123, a first input terminal 124 through which analog signals are input, a digital data output terminal 125, a code conversion circuit 126 for converting outputs of the voltage comparators 101 through 108 into a binary code, output impedances 127, 128, 129, 130, 131, 132, 133, and 134 of the respective voltage comparators 101 through 108, output lines 143, 144, 145, 146, 147, 148, 149, and 150 of the respective zero-impedance voltage comparators 101 through 108, output lines 151, 152, 153, 154, 155, 156, 157, and 158 connected to the comparators 101 through 108 via the output impedances 127 through 134, respectively, a switch control circuit 142, and switches 135, 136, 137, 138, 139, 140, and 141.

Supplied to the second input terminals 109 through 116 are, as illustrated in FIG. 3, reference voltages $V_{ref1}$ through $V_{ref8}$, the magnitudes of which are indicated as follows.

$$V_{ref1} > V_{ref2} > V_{ref3} > V_{ref4} > V_{ref5} > V_{ref6} > V_{ref7} > V_8$$

The switch control circuit 142 controls the opening and closing of the switches 135 through 141 based on the outputs of the voltage comparators 101 through 108 in accordance with the value of a converted digital signal. In FIG. 3, m number of voltage comparators are used in relation to n number of voltage comparators (m>n), which n number is usually and conventionally used, and among m number of voltage comparators, n number of the voltage comparators are selected according to the input voltage value.

More specifically, for example, when the input voltage $V_{in}$ satisfies $V_{ref4} - \Delta < V_{in} < V_{ref4} + \Delta$, the code conversion circuit 126 instructs the switch control circuit 142 to open the switches 135, 140, 141 and to close the switches 136, 137, 138, and 139 so as to select the voltage comparators 102, 103, 104, 105, and 106. When the input voltage $V_{in}$ satisfies $V_{ref3} - \Delta < V_{in} < V_{ref3} + \Delta$, the code conversion circuit 126 instructs the switch control circuit 142 to open the switches 139, 140, and 141 and to close the switches 135, 136, 137, and 138 so as to select the voltage comparators 101, 102, 103, 104, and 105. In this manner, the theory shown in FIG. 4 is implemented, and the ranges of the reference voltages used for comparison with input signals can be shifted according to the input voltage level. As a consequence, the voltage comparators can maintain their integral nonlinearity, thus exhibiting good performance.

In the second embodiment, the input voltage level is first checked by using m number of voltage comparators, and then, m/2+1 number of voltage comparators are selected in accordance with the input voltage level. This is done because the width m by which the seesaw is shifted, as shown in FIG. 4, is twice as long as the width by which the input voltage is shifted. In this embodiment, weights are assigned by resistors only to some voltage comparators having reference voltages around the input voltage level. Namely, any given number of voltage comparators may be selected in accordance with the input voltage level. Moreover, when the input signals are compared with the reference values by m number of voltage comparators, all the switches 135 through 141 may be opened.

Figure 5:
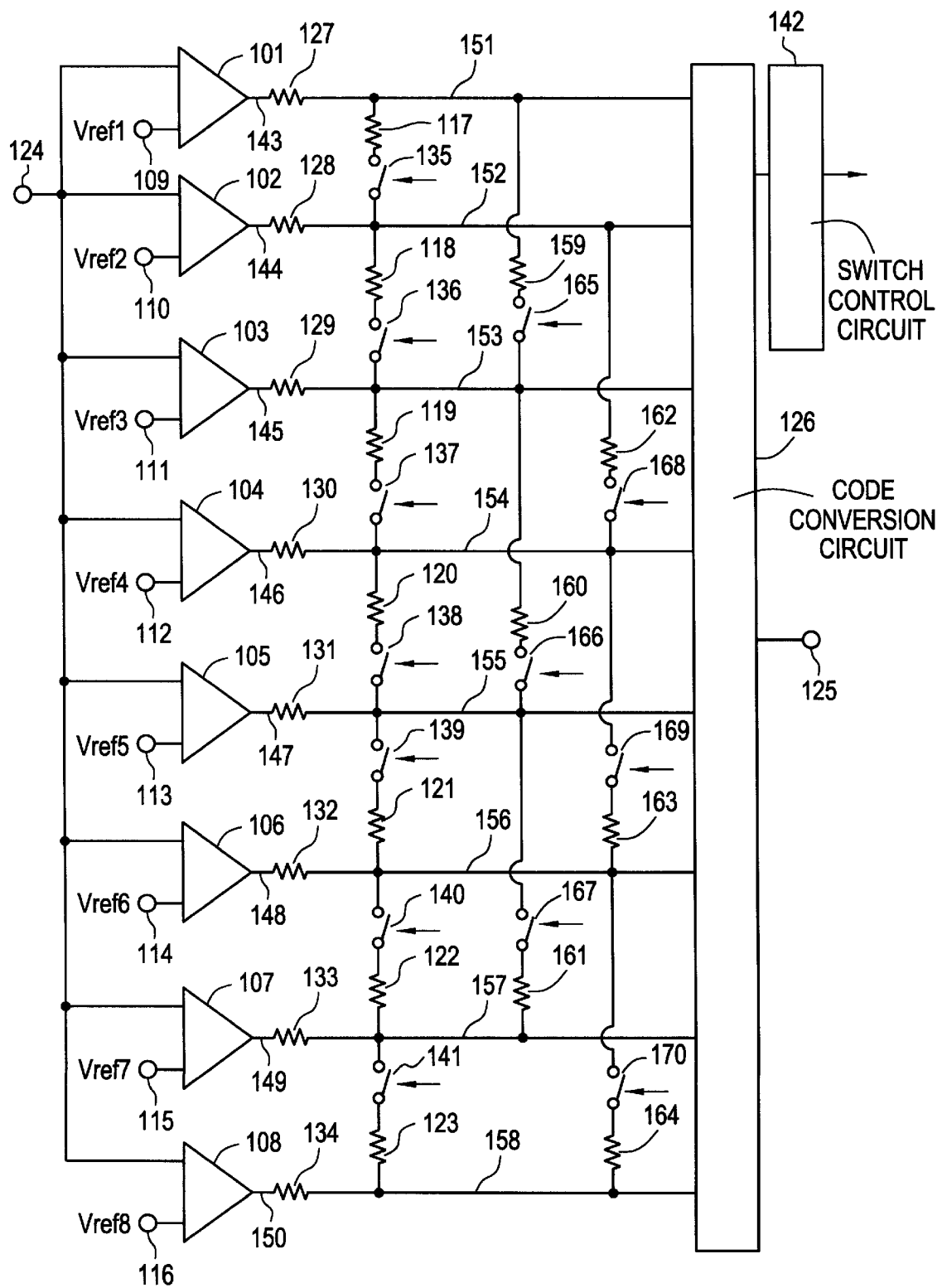
FIG. 5 illustrates an example of modifications made to the A/D converter circuit shown in FIG. 3.

FIG. 5 illustrates an example of modifications made to the A/D converter circuit of the second embodiment, i.e., an A/D converter circuit formed by a combination of the A/D converter circuits shown in FIGS. 1 and 3. Thus, the A/D converter circuit illustrated in FIG. 5 offers advantages exhibited by both converter circuits of the first and second embodiments. The A/D converter circuit shown in FIG. 5 differs from of the first and second embodiments in that second resistors 159, 160, 161, 162, 163, and 164, and switches 165, 166, 167, 168, 169, and 170 are added. In this A/D converter circuit, the switch control circuit 142 operates in the following manner in accordance with the level of the digital data converted from the input signal by the code conversion circuit 126.

When the input voltage $V_{in}$ satisfies $V_{ref3}-\Delta<V_{in}<V_{ref3}+\Delta$, the code conversion circuit 126 instructs the switch control circuit 142 to open the switches 139, 140, 141, 167, 169, and 170 and to close the switches 135, 136, 137, 138, 165, 166, and 168 so as to select the voltage comparators 101, 102, 103, 104, and 105. When the input voltage $V_{in}$ satisfies $V_{ref4}-\Delta<V_{in\ <Vref4}+\Delta$, the code conversion circuit 126 instructs the switch control circuit 142 to open the switches 135, 140, 141, 165, 167, and 170 and to close the switches 136, 137, 138, 139, 166, 168, and 169 so as to select the voltage comparators 102, 103, 104, 105, and 106. When the input voltage $V_{in}$ satisfies $V_{ref5}-\Delta<V_{in}<V_{ref5}+\Delta$, the code conversion circuit 126 instructs the switch control circuit 142 to open the switches 135, 136, 141, 165, 168, and 170 and to close the switches 137, 138, 139, 140, 166, 167, and 169 so as to select the voltage comparators 103, 104, 105, 106, and 107. When the input voltage $V_{in}$ satisfies $V_{ref6}-\Delta V_{in}<V_{ref6}+\Delta$, the code conversion circuit 126 instructs the switch control circuit 142 to open the switches 135, 136, 137, 165, 166, and 168 and to close the switches 138, 139, 140, 141, 167, 169, and 170 so as to select the voltage comparators 104, 105, 106, 107, and 108. As a consequence, the A/D converter circuit shown in FIG. 5 combines two functions of the A/D converter circuits shown in FIGS. 1 and 3.

Figure 6:
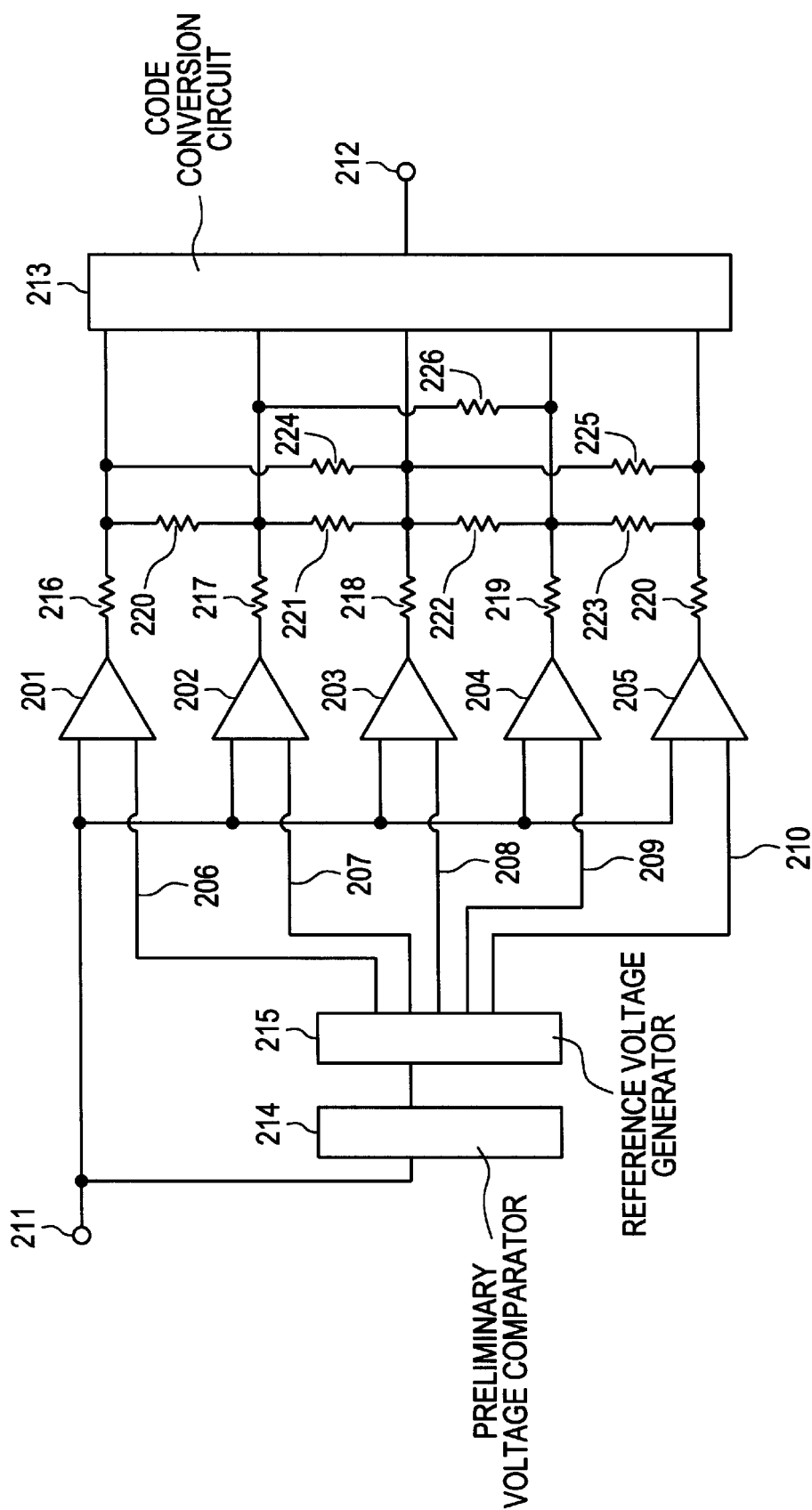
FIG. 6 illustrates another example of modifications made to the A/D converter circuit shown in FIG. 3.

FIG. 6 illustrates another example of modifications made to the A/D converter circuit of the second embodiment, and this modification is also based on the same theory illustrated in FIG. 4.

As shown in the middle part (b) and the upper part (c) of FIG. 4, in order to constantly keep the seesaw in balance, the seesaw plate is moved in accordance with the shifting of the support point. Another modification may be considered to move the seesaw plate in accordance with the shifting of the support point. An A/D converter circuit constructed in accordance with this idea is shown in FIG. 6.

In FIG. 6, the A/D converter circuit has ideal voltage comparators 201, 202, 203, 204, and 205, each having an output impedance of zero, input lines 206, 207, 208, 209, and 210 of the respective voltage comparators 201 through 205, first resistors 220, 221, 222, and 223, second resistors 224, 225, and 226, an analog input terminal 211, a digital data output terminal 212, a code conversion circuit 213 for converting outputs of the voltage comparators 201 through 205 into a binary code, output impedances 216, 217, 218, 219, and 220 of the respective voltage comparators 201 through 205, a preliminary voltage comparator 214, and a reference voltage generator 215.

With the above configuration, rough A/D conversion concerning higher order bits of digital data is initially performed on an analog input signal. Highly precise A/D conversion regarding lower order bits of digital data is then performed through voltage comparison by the voltage comparators 201 through 205, the voltage comparison being made accurately through the use of a resistor circuit network formed of the first resistors 220 through 223 and the second resistors 224 through 226. The foregoing preliminary voltage comparator 214 is used for performing rough A/D conversion concerning higher order bits of digital data on input signals, and is formed of as many comparators as the quantizing steps and a code conversion circuit.

The analog signal input into the input terminal 211 is further input into the preliminary voltage comparator 214 in which i satisfying the following expression is determined: $V_{ref\_i-1}<V_{in}<V_{ref\_i}$, where i indicates 1, 2, ..., n. According to the determined value of i, the reference voltage generator 215 supplies the potentials $V_{ref\_i-1}+2\Delta$, $V_{ref\_i-1+\Delta}$, $V_{ref\_i-1}$, $V_{ref\_i-1}-\Delta$, and $V_{ref\_i-1}-2\Delta$ to the input lines 206 through 210 of the voltage comparators 201 through 205, respectively. In the above potentials, $\Delta$ indicates $V_{ref\_i}-V_{ref\_i-1}$. In this manner, according to the modification illustrated in FIG. 6, the input voltage is modified by the preliminary voltage comparator 214 so that it constantly and equivalently corresponds to the middle point of the reference voltages generated by the reference voltage generator 215. Accordingly, the reference voltages of the voltage comparators 201 through 205 can always be around the input voltage $V_{in}$. The uniformity of input voltages prevents a degradation in the performance of the voltage comparators 201 through 205, thereby improving the integral nonlinearity.

Unlike the conventional A/D converter, this modification does not require precise comparison by the preliminary voltage comparator 214, since the voltage comparators 201 through 205 perform highly precise comparison later. Further, the value $\Delta$, which represents an amount of a change in the reference voltages of the comparators 201 through 205, is determined by how many higher order bits of digital data are produced by A/D conversion by the preliminary voltage comparator 214.

Figure 7:
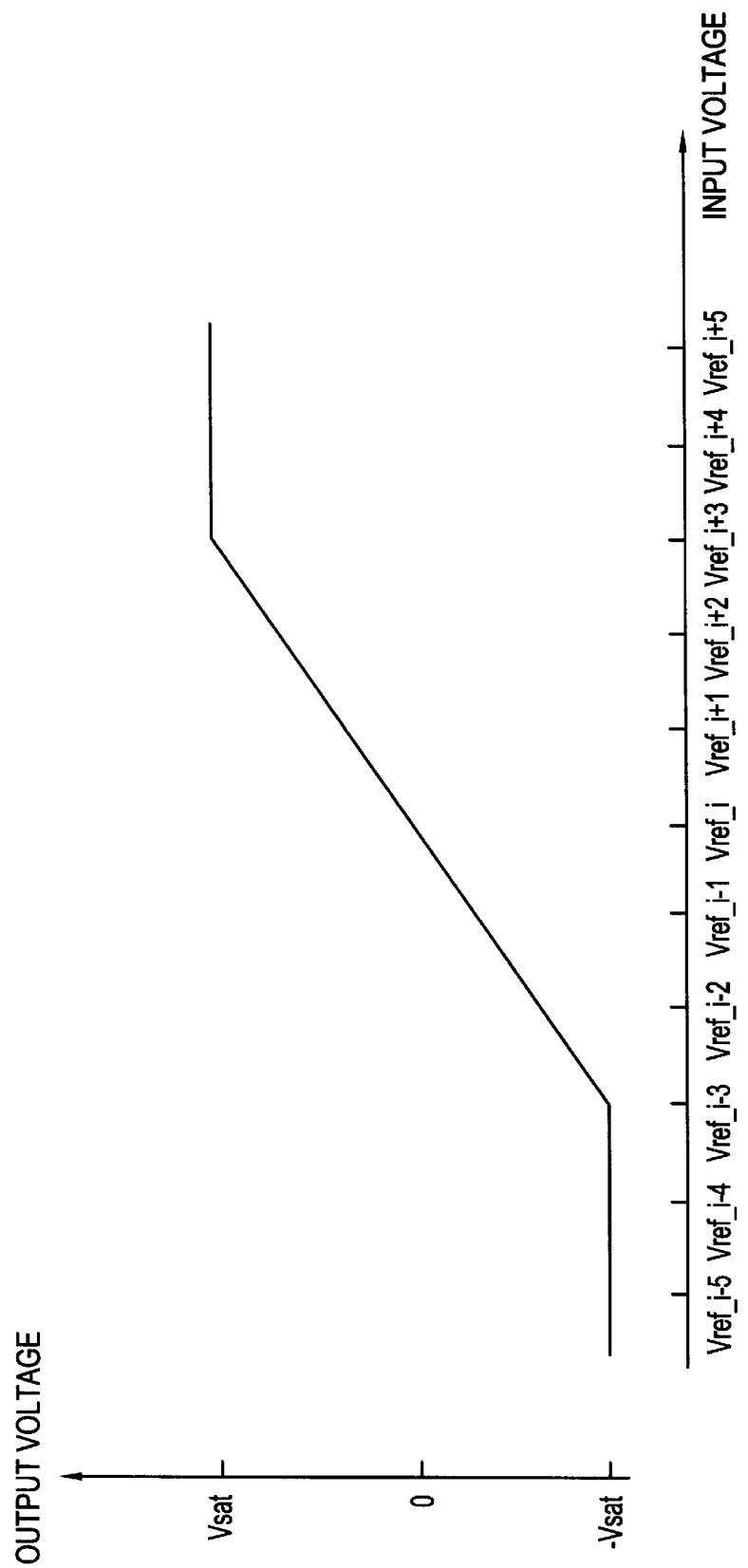
FIG. 7 illustrates the theory of an A/D converter circuit according to a third embodiment of the present invention.

A description is given below of an A/D converter circuit according to a third embodiment of the present invention. The third embodiment is based on the fact that the voltage comparators are circuits that perform nonlinear mapping having saturation characteristics, as noted above. FIG. 7 is a diagram illustrating the characteristics of input/output mapping of the voltage comparator. More specifically, the diagram of FIG. 7 represents the input/output characteristics of the i-th voltage comparator among n number of voltage comparators. It is now assumed that an input voltage is applied to the first input terminal of the voltage comparator and a reference voltage $V_{ref\_i}$ is applied to the second input terminal of the voltage comparator. The diagram shown in FIG. 7 indicates that the output voltage is substantially proportional to the input voltage when the input voltage $V_{in}$ satisfies the following range:

$$V_{ref\_i-k}<V_{in}<V_{ref\_i+k}$$

and where k equals three in the diagram of FIG. 7. However, if the input voltage $V_{in}$ satisfies the following range, $$V_{in}<V_{ref\_i-k}$$

a negative saturated output voltage $-V_{sat}$ is reached. Moreover, if the input voltage $V_{in}$ satisfies the following range, $$V_{ref\_i+k}<V_{in}$$

a positive saturated output voltage $+V_{sat}$ is reached.

Namely, among n number of voltage comparators, the voltage comparators lower than the (i−k)-th voltage comparator and the voltage comparators higher than the (i+k)-th voltage comparator output a constant negative saturated voltage $-V_{sat}$ and a constant positive saturated voltage $+V_{sat}$, respectively, regardless of the input voltage level $V_{in}$.

Referring back to equations (2) and (3), according to the A/D converter circuit shown in FIG. 1, the average output $V_{real\_i}$ (i=1, . . . , n) from the voltage comparators obtained by a resistor circuit network formed of the first resistors 11 through 14 and the second resistors 15 through 17 is expressed by the following equation (8) from the intrinsic output $V_{ideal\_i}$ (i=1, . . . , n) of the ideal voltage comparator:

$$V_{real\_i} = A'\{a^0 V_{ideal\_i} + a^1 V_{ideal\_i+1} + a^2 V_{ideal\_i+2} + \ldots + \quad (8)$$
$$a^1 V_{ideal\_i-1} + a^2 V_{ideal\_i-2} + \ldots$$

and where A' indicates the input-output conversion gain, a represents the degree of contribution to the output $V_{real\_i}$ of the i-th voltage comparator averaged by the resistor circuit network. a is smaller than unity and corresponds to $(Y_1+Y_2Y_C)$ in equation (2). While considering the above-described saturation voltages of the voltage comparators, the voltage comparators higher than the (i+k)-th voltage comparator output the positive saturation voltage $+V_{sat}$, while the voltage comparators lower than the (i−k)-th voltage comparator output the negative saturation voltage $-V_{sat}$. Thus, the average output $V_{real\_i}$ of the voltage comparators is expressed by the following equation (9).

$$V_{real\_-i} = A'\{a^0 V_{ideal\_i} + a^1 V_{ideal\_i+1} + \ldots + a^k V_{ideal\_i+k} + \quad (9)$$
$$a^{k+1} V_{sat}(1 + a + a^2 + \ldots)$$
$$a^1 V_{ideal\_i-1} + \ldots + a^k V_{ideal\_i-k} -$$
$$a^{k+1} V_{sat}(1 + a + a^2 + \ldots)$$

Further, the provision of an infinite number n (n→∞) of ideal voltage comparators, which seems to be infeasible, is assumed. Then, the average output $V_{real\_i}$ of the voltage comparators is expressed by the following equation (10).

$$V_{real\_-i} = A'\{a^0 V_{ideal\_i} + a^1 V_{ideal\_i+1} + \ldots + a^k V_{ideal\_i+k} + \quad (10)$$
$$a^{k+1} V_{sat} \frac{1}{1-a} +$$
$$a^1 V_{ideal\_i-1} + \ldots + a^k V_{ideal\_i-k} -$$
$$a^{k+1} V_{sat} \frac{1}{1-a}$$

According to equation (9), when the input voltage $V_{in}$ is around the reference voltage $V_{ref\_i}$ of the i-th voltage comparator, the outputs of the comparators higher than the (i+k)-th comparator and the comparators lower than the (i−k)-th comparator can be equivalently expressed by ±Vsat·(1/(1-a)).

Figure 8:
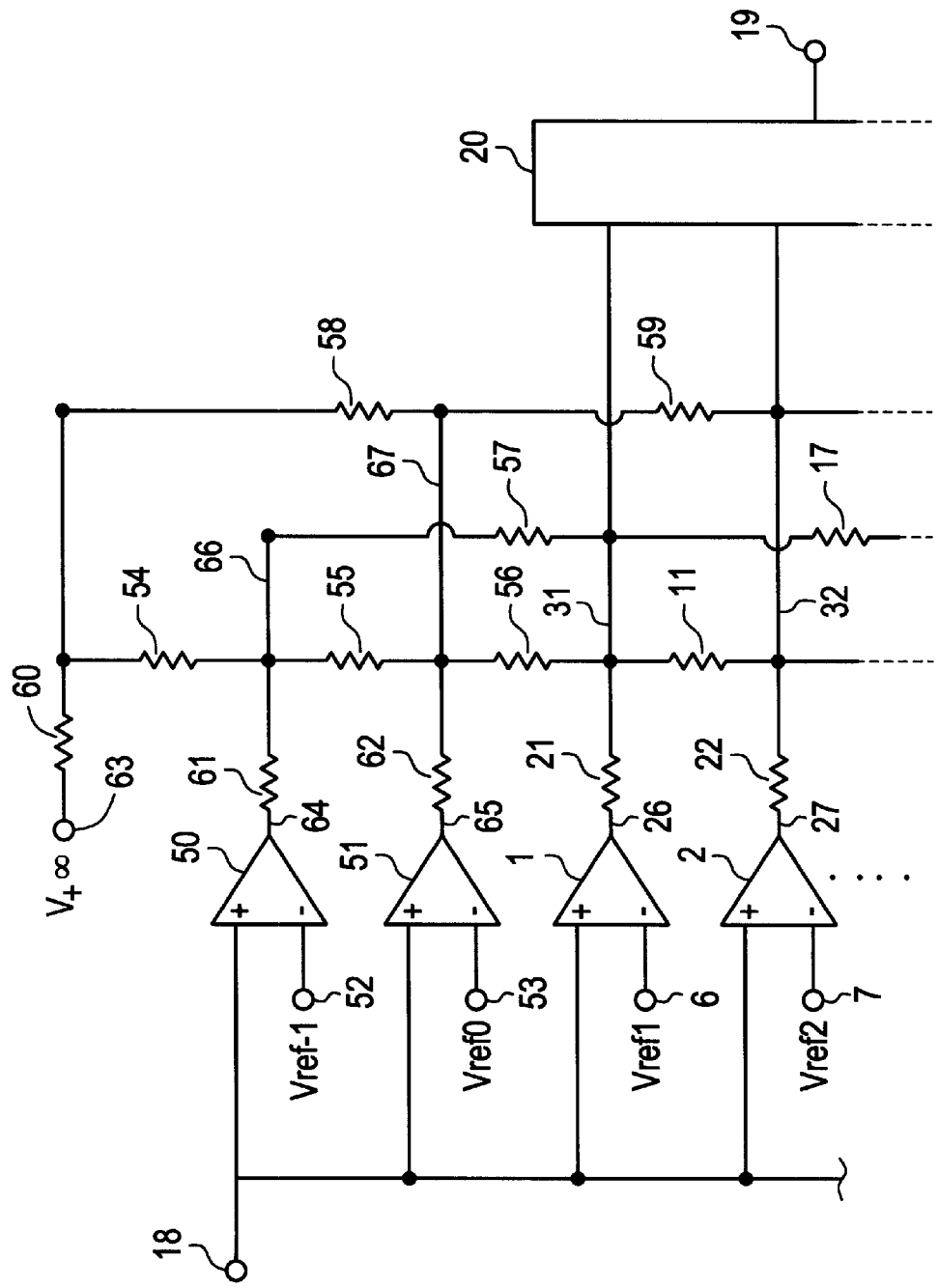
FIG. 8 illustrates the configuration of the A/D converter circuit according to the third embodiment of the present invention.

The A/D converter circuit shown in FIG. 8 is configured based on the above concept according to the third embodiment of the present invention. The A/D converter circuit shown in FIG. 8 has been further improved over the A/D converter circuit illustrated in FIG. 1. The same elements as those shown in FIG. 1 are designated with like reference numerals. In the third embodiment, it is assumed that k is two, and virtual power voltages, virtual resistors, and virtual comparators are disposed at the outer side of each of the comparators 1 and 5 of FIG. 1. Then, the resulting A/D converter circuit is configured as if an infinite number of comparators were provided. In FIG. 8, only the upper part of the A/D converter circuit corresponding to the upper part of the A/D converter circuit illustrated in FIG. 1 is shown. The lower part is configured similarly to the upper part and they are therefore symmetrical to each other.

In FIG. 8, the A/D converter circuit includes ideal voltage comparators 1, 2, 50, and 51, each having an output impedance of zero, second input terminals 6, 7, 52, and 53 of the respective voltage comparators 1, 2, 50, and 51, first resistors 11, 55, and 56, second resistors 17, 57, and 59, a first input terminal 18, an output terminal 19, a code conversion circuit 20 for converting the outputs of the voltage comparators 1, 2, 50, and 51 into a binary code, output impedances 21, 22, 61, and 62 of the respective voltage comparators 1, 2, 50, and 51, output lines 26, 27, 64, and 65 of the zero-impedance voltage comparators 1, 2, 50, and 51, output lines 31, 32, 66, and 67 connected to the comparators 1, 2, 50, and 51 via the output impedances 21, 22, 61, and 62, respectively, an additional power supply voltage terminal 63 for applying a voltage V+∞ corresponding to an infinite number +∞ of voltage comparators, and additional, third resistors 60, 54, and 58. The voltage comparators 50 and 51 serve as additional voltage comparators corresponding to i−1 and i−2, respectively.

Supplied to the second input terminals 6, 7, 52, and 53 of the voltage comparators 1, 2, 50, and 51 are reference voltages $V_{ref1}$, $V_{ref2}$, $V_{ref-1}$, and $V_{ref0}$, respectively, the magnitudes of which are indicated as follows.

$$V_{ref-1} > V_{ref0} > V_{ref1} > V_{ref2} > \ldots$$

As noted above, k is determined to be two in the third embodiment illustrated in FIG. 8. The potential V+∞ corresponds to or is proportional to $V_{sat}$ (1/1-a) in equation (10). The third resistor 60 conforms to the output impedances 21, 22, 61, and 62, the third resistor 54 conforms to the first resistors 11, 55, and 56, and the third resistor 58 conforms to the second resistors 17, 57, and 59. The third resistors 60, 54, and 58 are provided to add the virtual power supply voltage V+∞ applied through the terminal 63 to the outputs of the comparators shown in FIG. 1, and the resistances of the resistors 60, 54, and 58 are selected to realize equation (10).

In the third embodiment, the terms $a^{k+1}$ and $V_{sat}$ (1/1-a) in equation (10) are realized by the potential applied to the terminal 63 and by the third resistors 60, 54, and 58. In this embodiment, it is assumed that the permissible input voltage range to be compared is $V_{in} < V_{ref1}$. In this manner, by virtue of the additional third resistors 60, 54, and 58 and the additional power potential V+∞, the A/D converter circuit is configured as if an infinite number of voltage comparators were disposed. This prevents an output voltage from being biased to a higher level or a lower level caused by the input voltage level. The seesaw is thus kept in good balance, as indicated by the theory shown in FIG. 4. It is thus possible to provide voltage comparators that exhibit good performance free from a degradation in integral nonlinearity.

As an example of the value of V+∞ for the circuit shown in FIG. 8, when $Y_0=0.001$, $Y_1=0.001$, $Y_c=0.001$ in equation (3), "A'" and "a" in equation (8) become A'=90909, and a=0.001. Then, Vinfinte=+/1.001 (V) (in case $V_{sat}$=1 (V)).

A fourth embodiment of the present invention is described below with reference to FIG. 9.

Figure 9:
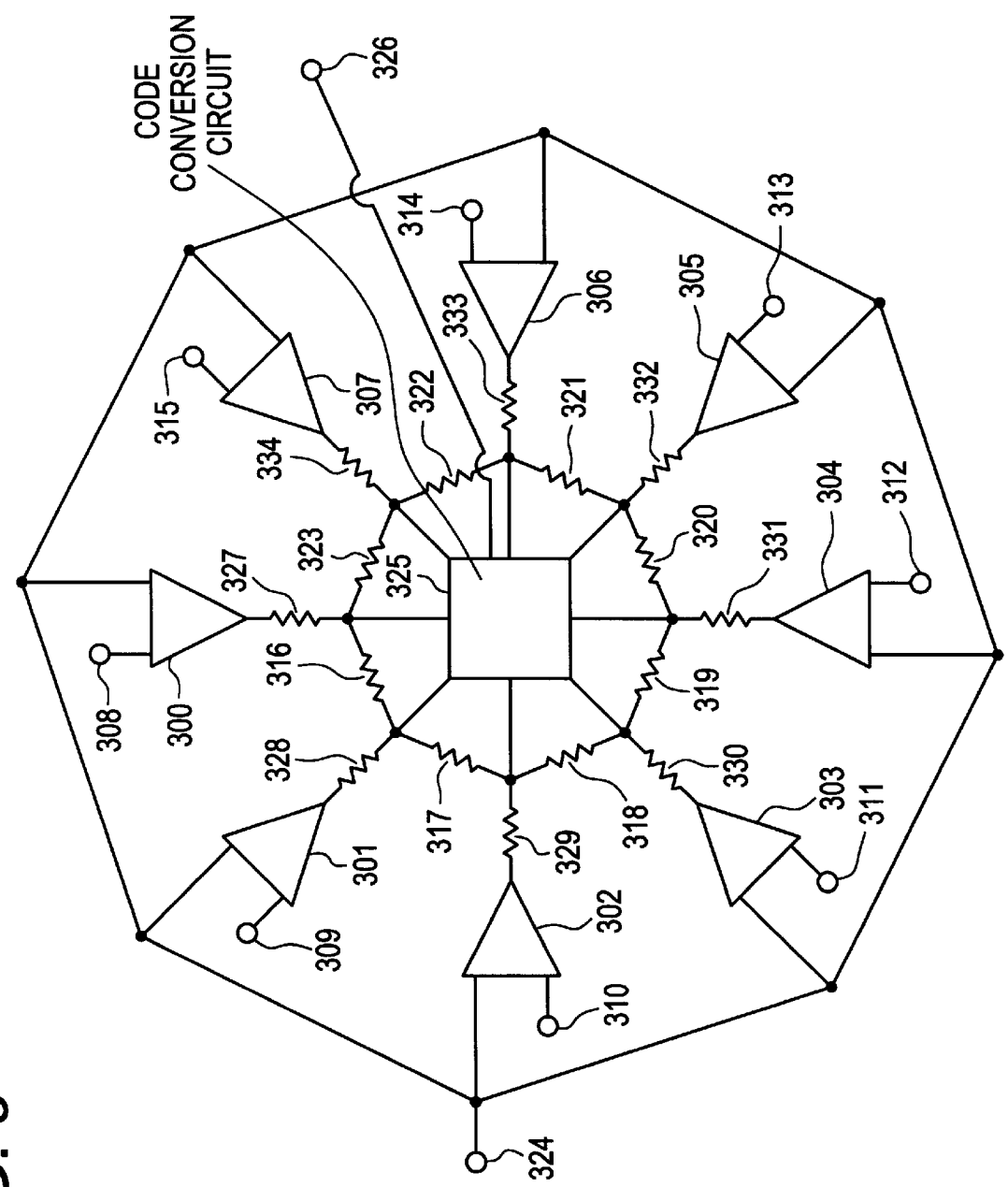
FIG. 9 illustrates the configuration of an A/D converter circuit according to a fourth embodiment of the present invention.

In FIG. 9, an A/D converter circuit includes ideal voltage comparators 300, 301, 302, 303, 304, 305, 306, and 307, each having an output impedance of zero, second input terminals 308, 309, 310, 311, 312, 313, 314, and 315 of the respective voltage comparators 300 through 307, first resistors 316, 317, 318, 319, 320, 321, 322, and 323, a first input terminal 324, an output terminal 326, a code conversion circuit 325 for converting the output of the voltage comparators 300 through 307 into a binary code, and output impedances 327, 328, 329, 330, 331, 332, 333, and 334 of the respective impedance-zero voltage comparators 300 through 308. In the fourth embodiment, the voltage comparators 300 through 307 are disposed in a ring-like form in order of reference voltages supplied to the second input terminals 308 through 315, respectively. This eliminates the presence of peripheral voltage comparators, thereby enhancing conversion precision. Further, in order to keep the seesaw in good balance, reference voltages may be randomly selected and supplied to the second input terminals 308 through 315. In this case, A/D conversion is not adversely influenced by peripheral voltage comparators located farther away from the center comparator.

In FIG. 9, second resistors are not shown. However, second resistors may be provided to implement the A/D converter circuit that also offer the advantages of the first embodiment illustrated in FIG. 1. Moreover, for completely connecting the output terminals of the voltage comparator formed in a ring-like shape, the output terminals may be connected via resistors, the values of which are determined corresponding to the distances between the output terminals.

The foregoing embodiments may be modified as follows. Circuitry for calculating a difference between an input signal and an output signal of the voltage comparators may be provided, and the difference may be fed back and newly input into the voltage comparators. Then, the resulting A/D converter circuit is able to separately perform the higher order and the lower order A/D conversion, thereby achieving a reduction in the cost of hardware. The above type of circuitry may be easily implemented by a digital-to-analog (D/A) conversion circuit for converting the output signal of the comparators into an analog signal, and a subtraction circuit for determining the difference between an input signal and an output of the D/A conversion circuit.

Differential amplifiers may be used as the voltage comparators employed in the foregoing embodiments. Moreover, the voltage comparators may be of the type having a finite output impedance or having a zero output impedance. If the zero-impedance voltage comparators are used as in the foregoing embodiments, one end of a resistor may be connected to the output of each voltage comparator and the other end of the resistor may be used as the output of the comparator.

Additionally, in the foregoing embodiments, a voltage comparator is connected to the adjacent comparator via a first resistor and is connected to the adjacent comparator but one via a second resistor. In this manner, the comparator may be connected to the adjacent comparator but two and the adjacent comparator but three by providing extra resistors. This makes it possible to further enhance conversion precision and conversion speed.

As is seen from the foregoing description, the present invention offers the following advantages. A technique for adding and averaging outputs of a plurality of voltage comparators is provided. Further, the outputs of the peripheral comparators positioned away from the center comparator are suitably processed. This makes it possible to improve comparison precision without increasing the time required for voltage comparison performed by the voltage comparators, thereby achieving a high-speed and highly precise A/D converter circuit.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An analog-to-digital converter circuit comprising:

N number of voltage comparators, each of said N number of voltage comparators having a first input terminal, a second input terminal, and an output terminal, an input signal being supplied to said first input terminals of said N number of voltage comparators, and N number of different reference voltages being supplied to said second input terminals of said N number of voltage comparators, respectively, wherein said analog-to-digital converter circuit converts outputs of said N number of voltage comparators into digital data and outputs the digital data; and N-n1 (n1>1) number of first resistors for connecting the output terminals of said N number of voltage comparators, said first resistors being arranged in accordance with levels of said N number of reference voltages, each of said N-n1 number of first resistors connecting the output terminals of two of said N number of voltage comparators which are positioned away from each other by n1 number of voltage comparators.

2. An analog-to-digital converter circuit according to claim 1, further comprising N-1 number of second resistors for connecting the output terminals of said N number of voltage comparators, each of said N-1 number of second resistors connecting the output terminals of two of said N number of voltage comparators which are positioned adjacent to each other.

3. An analog-to-digital converter circuit according to claim 1, further comprising N-n2 (n2>n1) number of third resistors for connecting the output terminals of said N number of voltage comparators, each of said N-n2 number of third resistors connecting the output terminals of two of said N number of voltage comparators which are positioned away from each other by n2 number of voltage comparators.

4. An analog-to-digital converter circuit according to claim 2, further comprising N-n2 (n2>n1) number of third resistors for connecting the output terminals of said N number of voltage comparators, each of said N-n2 number of third resistors connecting the output terminals of two of said N number of voltage comparators which are positioned away from each other by n2 number of voltage comparators.

5. An analog-to-digital converter comprising:

N number of voltage comparators, each of said N number of voltage comparators having a first input terminal, a second input terminal, and an output terminal, an input signal being supplied to said first input terminals of said N number of voltage comparators, and N number of different reference voltages being supplied to said second input terminals of said N number of voltage comparators, respectively, wherein said analog-to-digital converter circuit converts outputs of said N number of voltage comparators into digital data and outputs it;

N-n1 (n1>1) number of first resistors or N-1 number of second resistors, said N-n1 number of first resistors being used for connecting the output terminals of said N number of voltage comparators, which are arranged in accordance with levels of said N number of reference voltages, each of said N-n1 number of first resistors connecting the output terminals of two of said N number of voltage comparators which are positioned away from each other by n1 number of voltage comparators, said N−1 number of second resistors connecting the output terminals of said N number of voltage comparators, each of said N−1 number of second resistors connecting the output terminal of two of said N number of voltage comparators which are positioned adjacent to each other; and means for selecting, based on the outputs of said N number of voltage comparators, M (M<N) number of voltage comparators from said N number of voltage comparators in accordance with the voltage level of said input signal.

6. An analog-to-digital converter circuits comprising:

N number of voltage comparators, each of said N number of voltage comparators having a first input terminal, a second input terminal, and an output terminal, an input signal being supplied to said first input terminals of said N number of voltage comparators, and N number of different reference voltages being supplied to said second input terminals of said N number of voltage comparators, respectively, wherein said analog-to-digital converter circuit converts outputs of said N number of voltage comparators into digital data and outputs it; and N-n1 (n1≧1) number of first series circuits, each of said N-n1 number of first series circuits being formed by connecting a first resistor and a first switch in series to each other, for connecting the output terminals of said N number of voltage comparators, which are arranged in accordance with levels of said N number of reference voltages, each of said N-n1 number of first series circuits being used for connecting the output terminals of two of said N number of voltage comparators which are positioned away from each other by n1 number of voltage comparators, wherein opening and closing of said first switches of said N-n1 of first series circuit are controlled based on outputs of said N number of voltage comparators so as to select M (M<N) number of voltage comparators from said N number of voltage comparators in accordance with the voltage level of said input signal.

7. An analog-to-digital converter circuit according to claim 6, further comprising N-n2 (n2>n1) number of second series circuits, each of said N-n2 number of second series circuits being formed by connecting a second resistor and a second switch in series to each other, for connecting the output terminals of said N number of voltage comparators, each of said N-n2 number of second series circuits connecting the output terminals of two of said N number of voltage comparators which are positioned away from each other by n2 number of voltage comparators, wherein opening and closing of said second switches of said second series circuits are controlled based on outputs of said N number of voltage comparators.

8. An analog-to-digital converter circuit comprising:

N number of voltage comparators, each of said N number of voltage comparators having a first input terminal, a second input terminal, and an output terminal, an input signal being supplied to said first input terminals of said N number of voltage comparators, and N number of different reference voltages being supplied to said second input terminals of said N number of voltage comparators, respectively, wherein said analog-to-digital converter circuit converts outputs of said N number of voltage comparators into digital data and outputs the digital data;

N-n1 (n1≧1) number of first resistors for connecting the output terminals of said N number of voltage comparators, which are arranged in accordance with levels of said N number of reference voltages, each of said N-n1 number of first resistors connecting the output terminals of two of said N number of voltage comparators which are positioned away from each other by n1 number of voltage comparators;

means for performing analog-to-digital conversion corresponding to higher order bits of the digital data based on the voltage level of said input signal; and means for generating said N number of reference voltages supplied to said second terminals of said N number of voltage comparators based on the conversion output of the higher order bits of the digital data so that the middle point of the range of said N number of reference voltages corresponds to the level of said input signal.

9. An analog-to-digital converter circuit according to claim 8, further comprising N-n2 (n2>n1) number of second resistors for connecting the output terminals of said N number of voltage comparators, each of said N-n2 number of second resistors connecting the output terminals of two of said N number of voltage comparators which are positioned away from each other by n2 number of voltage comparators.

10. An analog-to-digital converter circuit comprising:

N number of voltage comparators, each of said N number of voltage comparators having a first input terminal, a second input terminal, and an output terminal, an input signal being supplied to said first input terminals of said N number of voltage comparators, and N number of different reference voltages being supplied to said second input terminals of said N number of voltage comparators, respectively, whereby said analog-to-digital converter circuit converts outputs of said N number of voltage comparators into digital data and outputs the digital data;

N-n1 (n1≧1) number of first resistors for connecting the output terminals of said N number of voltage comparators, which are arranged in accordance with levels of said N number of reference voltages, each of said N-n1 number of first resistors connecting the output terminals of two of said N number of voltage comparators which are positioned away from each other by n1 number of voltage comparators;

a first power supply source provided at an outer side of one of the voltage comparators which is positioned farthest away from the center voltage comparator among said N number of voltage comparators, said first power supply source generating a predetermined voltage determined by a positive saturated output voltage of said N number of voltage comparators;

a second power supply source provided at an outer side of the other voltage comparator which is positioned farthest away from the center voltage comparator among said N number of voltage comparators, said second power supply source generating a predetermined voltage determined by a negative saturated output voltage of said N number of voltage comparators; and first and second additional resistors via which said first and second power supply sources are respectively connected to outputs of said two voltage comparators which are positioned farthest away from the center voltage comparator.

11. An analog-to-digital converter circuit according to claim 10, further comprising:

N-n2 (n2>n1) number of second resistors for connecting the output terminals of said N number of voltage comparators, each of said N-n2 number of second resistors connecting the output terminals of two of said N number of voltage comparators which are positioned away from each other by n2 number of voltage comparators; and third and fourth additional resistors via which said first and second power supply sources are respectively connected to outputs of said two voltage comparators which are positioned farthest away from the center voltage comparator.

12. An analog-to-digital converter circuit comprising:

N number of voltage comparators disposed in a ring-like shape, each of said N number of voltage comparators having a first input terminal, a second input terminal, and an output terminal, an input signal being supplied to said first input terminals of said N number of voltage comparators, and N number of different reference voltages being supplied to said second input terminals of said N number of voltage comparators, respectively, wherein said analog-to-digital converter circuit converts outputs of said N number of voltage comparators into digital data and outputs the digital data; and N-n1 (n1≧1) number of first resistors and N-n2 (n2>n1) number of second resistors, said N-n1 number of first resistors connecting the output terminals of said N number of voltage comparators, each of said N-n1 number of first resistors connecting the output terminals of two of said N number of voltage comparators which are positioned away from each other by n1 voltage comparators, and said N-n2 number of second resistors connecting the output terminals of said N number of voltage comparators, each of said N-n2 number of second resistors connecting the output terminals of two of said N number of voltage comparators which are positioned away from each other by n2 voltage comparators.

* * * * *